United States Patent [19]

Kamio et al.

[11] Patent Number: 4,793,692

[45] Date of Patent: Dec. 27, 1988

[54] COLOR FILTER

[75] Inventors: Masaru Kamio, Atsugi; Taiko Motoi; Hideaki Takao, both of Sagamihara, all of Japan

[73] Assignee: Canon Kabushiki Kaisha, Tokyo, Japan

[21] Appl. No.: 808,507

[22] Filed: Dec. 13, 1985

[30] Foreign Application Priority Data

| | | | |
|---|---|---|---|
| Dec. 14, 1984 | [JP] | Japan | 59-262675 |
| Dec. 26, 1984 | [JP] | Japan | 59-276940 |
| Dec. 28, 1984 | [JP] | Japan | 59-276989 |

[51] Int. Cl.[4] .................... G02B 5/20

[52] U.S. Cl. .................... 350/311; 252/582; 350/349

[58] Field of Search .................... 252/582, 600, 299.1; 350/311

[56] References Cited

U.S. PATENT DOCUMENTS

| | | | |
|---|---|---|---|
| 4,107,133 | 8/1978 | Sawai et al. | 260/42.15 |
| 4,682,019 | 7/1987 | Nakatsui et al. | 250/211 R |

OTHER PUBLICATIONS

Kropf et al., "Autooxidation . . . ," Tetrah. Letters., No. 7, pp. 659-663, 1967.

Wohrle et al., "Polymeric Bound . . . " Makromol. Chem., 187, 2535-2544, 1986.

Gavrilov et al., "Cation-Complexes . . . " Zh. Fiz. Khim. 60(6), 1448-51, 1986.

Mokshin, "Structural Factors . . . " Sov. J. Chem. Phys., vol. 4(3), 1987, pp. 525-531.

Ohtani et al., "Efficient Photoreduction . . . , " Photochem. Photobiol. 44(2), 125-9, 1986.

Uth et al., "Effect of Electron Acceptors . . . ," Bremer Briefe zur Chemie., 2(1), 5-29.

Mikhalenko et al., Zh. Obshch. Khim, 46(7), 1598-602.

Derkachev, Zh. Obshch. Khim. 53(1), 188-92.

Gavrilov, Zh. Obshch. Khim. 53(6), 1347-52.

Derkacheva, Zh. Obshch. Khim. 51(10), 2319-24.

Lebedev, Opt. Spektrosk., 30(4), 640-3.

*Primary Examiner*—Matthew A. Thexton

*Assistant Examiner*—Catherine S. Kilby

*Attorney, Agent, or Firm*—Fitzpatrick, Cella, Harper & Scinto

[57] ABSTRACT

A color filter is provided by forming a vapor-deposited green colorant layer of an octa-4,5-phenylphthalocyanine colorant which is octa-4,5-phenylphthalocyanine or a metal complex thereof represented by the formula:

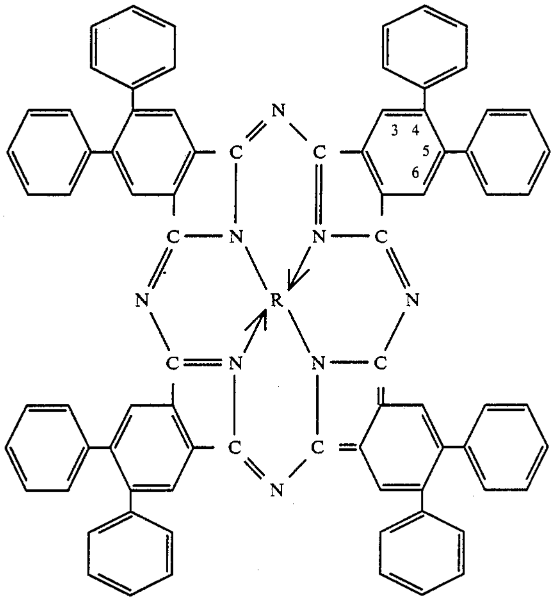

wherein R is Cu, GaOH, VO, Ni, Pd, Pb, Mg, Ca or Co. The spectral characteristics of the green colorant layer may be corrected with a yellow colorant such as an isoindolinone colorant or an anthraquinone colorant.

25 Claims, 6 Drawing Sheets

COLOR FILTER

FIELD OF THE INVENTION AND RELATED ART

This invention relates to a color filter, particularly to a color filter suitable for fine color separation such as those used in color image pick-up device, color sensor and color display device.

As a color filter, a dyed color filter obtained by providing a mordant layer comprising a hydrophilic polymeric material such as gelatin, casein, glue or polyvinyl alcohol on a substrate and dyeing the mordant layer with a colorant to form a color layer is known. Such a dyeing method has such advantages that there are a large number of available dyes and the required spectral characteristics can be satisfied with relative ease but is accompanied with several difficulties such that a wet step of dipping a mordant layer in a dyeing bath containing a dye dissolved therein which can be controlled only with difficulty is used for the step of dyeing the mordant layer and also complicated steps for providing an intermediate layer for prevention of dyeing for each layer are included, whereby the yield of production becomes poor. Also, the colorants which can be used are relatively low in heat resistance, namely up to a temperature of about 150° to 160° C. so that it is difficult to use them in the steps where thermal treatment is required.

In contrast, there is also known the vapor deposition process including the evaporation process in which a thin film of a colorant such as dye or pigment is formed as the color layer (Japanese Laid-Open Patent Application No. 146406/1980, etc.).

According to this process, since the color layer can be formed with the colorant itself, the color layer can be formed more thinly as compared with the dyeing method, whereby the color filter can be made thinner, and management and control of the steps can be easily done because they are non-aqueous steps. Also, the vapor-deposited colorant layer is good in heat resistance and can be resistant to a step where thermal treatment is required. Further, there is also an advantage that the photolithographic steps can be directly applied for patterning of the color layer.

On the other hand, a color filter forming a color filter is required to have several characteristics as described below. First, it must have desired spectral characteristics as an optical filter.

Also, from the point of manufacture of a color filter, if a colorant cannot be used stably in manufacture of a color filter in spite of good spectral characteristics or it requires a special treatment step, lowering in yield is brought about, whereby only an unsuitable color filter can consequently be obtained. Therefore, a colorant for color filter must be selected optimally with good balance between spectral characteristics and manufacturing.

When formation of a color filter is practiced by the vapor deposition process, restrictions from the aspect of manufacturing are strongly incurred on the colorant employed such as having heat resistance, being readily vaporizable and also resistant to solvent treatment in the photolithographic steps, whereby the available colorants are limited. For this reason, in spite of various advantages as mentioned above as compared with the dyeing method, color filters formed by the vapor deposition process have not been widely used.

Thus, colorants capable of vapor deposition are limited, and even when a color may be formed with the use of a colorant capable of vapor deposition, desired spectral characteristics cannot be obtained in the color filter in most cases. Also, many of the colorants capable of vapor deposition cannot give desired spectral characteristic, because the colorant film can be dissolved during the steps of resist coating, solvent treatment for developing, etc., during patterning of the vapor deposited layer of a colorant, or changed in spectral characteristic even if not dissolved.

For example, when a green color layer is to be formed according to the vapor deposition process, a phthalocyanine type colorant has been frequently used in the prior art. Most of the phthalocyanine type colorants for formation of a vapor-deposited layer previously known, while being excellent in adaptability to vapor deposition and solvent resistance due to the basic structure of phthalocyanine ring which is very stable both chemically and thermally, are generally shifted toward the blue side and therefore they did not have necessarily satisfactory spectral characteristics when employed to provide a strictly green color.

SUMMARY OF THE INVENTION

The present invention has been accomplished in view of such problems, particularly based on a discovery of a suitable colorant well balanced between aspects of spectral characteristics and manufacturing for forming a green color layer of a color filter according to the vapor deposition.

An object of the present invention is to provide a color filter having a color layer formed from a colorant, which is excellent in heat resistance and solvent resistance, and also excellent in spectral characteristics, according to the vapor deposition.

Particularly, it is intended to provide a color filter having a green color layer with excellent spectral characteristics, which cannot be satisfied easily with a conventional green color layer.

According to the present invention, there is provided a color filter comprising a green colorant layer of a vapor-deposited octa-4,5-phenylphthalocyanine pigment. The green colorant layer may further contain an isoindolinone colorant or an anthraquinone colorant.

These and other objects, features and advantages of the present invention will become more apparent upon a consideration of the following description of the preferred embodiments of the present invention taken in conjunction with the accompanying drawings.

DETAILED DESCRIPTION OF THE INVENTION

Figure 1:
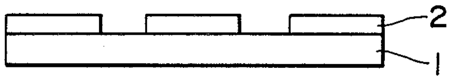
FIGS. 1–6 show steps for illustration of the process for preparing a color filter of the present invention.

As the colorant which can form the green color layer of the color filter of the present invention, for example, (metal free) octa-4,5-phenylphthalocyanine, and a metal complex of octa-4,5-phenylphthalocyanine represented by the formula shown below may be employed:

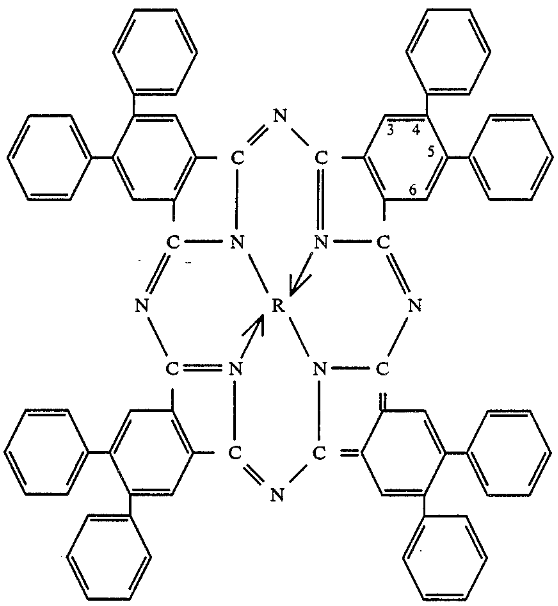

In the above formula, R is Cu, GaOH, Vo, Ni, Pd, Pb, Mg, Ca or Co.

The colorant to be used in the vapor deposition process must be in itself excellent in heat resistance. Generally speaking, many of organic colorants are thermally unstable and susceptible to decomposition, although more or less different depending on their chemical structures.

In contrast, the colorant capable of forming the green colorant layer of the color filter of the present invention, is thermally very stable due to its phthalocyanine ring without decomposition even when heated, having a property of being readily susceptible of vapor deposition at or above a certain temperature, and hence very suitable for formation of a colorant layer by vapor deposition. Further, the vapor-deposited colorant layer formed is stable even after the steps of patterning, heat treatment, etc., subsequently conducted as desired without change or denaturation in its spectral characteristics.

Also, the above class of colorants among phthalocyanine type colorants exhibit excellent spectral characteristics as green color a exhibited by the Examples as described in detail hereinafter.

Further, the deposited layer of the above colorant formed by vapor deposition is not so sparse as frequently seen in organic films but very dense, and yet, for example, strongly adhered onto the surface of an inorganic material such as glass to be used as the substrate, thus having excellent physical properties as vapor-deposited film.

The above octa-4,5-phenylphthalocyanine type colorant contains slightly a blue spectral component. For this reason, when it is to be used as a strict green colorant layer, the above octa-4,5-phenylphthalocyanine type colorant can be subjected to color correction with other colorants to be made a strict green colorant layer.

The colorant to be used for color correction of an octa-4,5-phenylphthalocyanine should be a yellow colorant having sharp rise characteristic. It is also required to be endowed with both adaptability to vapor deposition and solvent resistance comparable to the octa-4,5-phenylphthalocyanine type colorant, since it is to be formed according to the vapor deposition. The isoindolinone type yellow colorant and the anthraquinone type yellow colorant are preferably used in the present invention because they are satisfactory in all of these characteristics and make it possible to form a green color layer excellent by vapor deposition in combination with the octa-4,5-phenylphthalocyanine type colorant.

The isoindolinone type colorant of yellow colorant to be used in the present invention has an aromatic fused polycyclic structure containing hetero atoms and can be represented basically by the formula shown below:

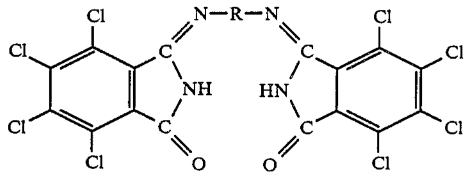

In the formula, depending on the structure of R (divalent organic group), the color may change from yellow to orange, reddish brown, but this colorant is particularly excellent as a yellow colorant for its colorfulness and sharp spectral characteristics.

Examples of the isoindolinone type colorants may include those wherein R is a group as shown below:

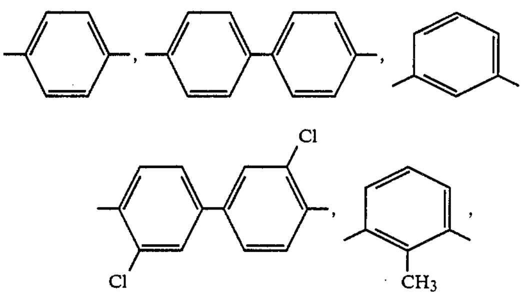

-continued

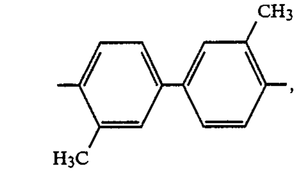

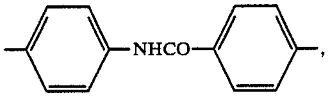

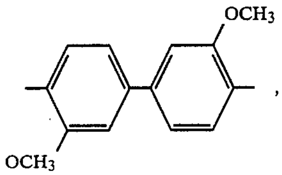

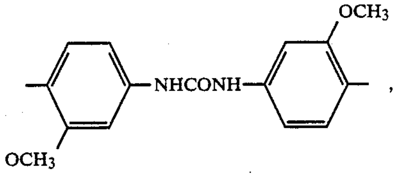

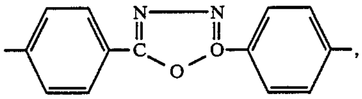

-continued

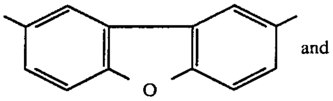

and

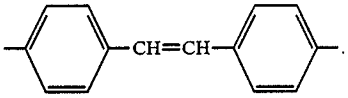

Commercially available products (trade names) of such isoindolinone type colorants are as follows: Irgadine Yellow 2GLT, 2GLTE, 2GLTN (produced by Ciba Geigy), Lionogen Yellow 3GX (produced by Toyo Ink), Fastgen Super Yellow GR, GRO, GROH (produced by Dainippon Ink), Irgadine Yellow 2RLT, 3RLT, 3RLTN (produced by Ciba Geigy), Lionogen Yellow RX (produced by Toyo Ink), Lithol Fast Yellow 1840 (produced by BASF), Kayaset Yellow E-2RL, E-3RL 176 (produced by Nippon Kayaku), Chromophthal Orange 2G (produced by Ciba Geigy) and Irgadine Red 2BLR (produced by Ciba Geigy).

On the other hand, the anthraquinone type colorant to be used in the present invention refers to a derivative of anthraquinone and a homologous polycyclic quinone. The anthraquinone type colorant is thermally stable without decomposition at a high temperature, having a property of being readily vaporized above a certain temperature, and hence very suitable for formation of a thin film of colorant by vapor deposition.

Examples of the anthraquinone type yellow colorant may include the following compounds:

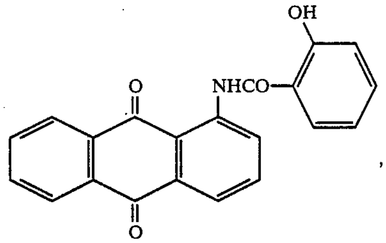

,

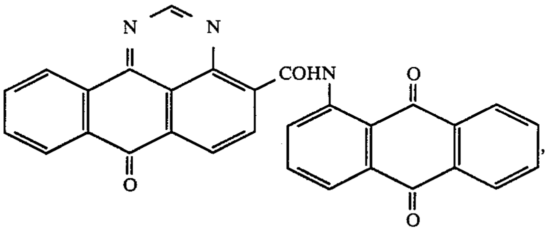

,

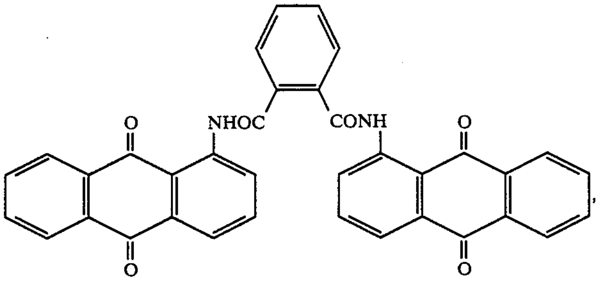

,

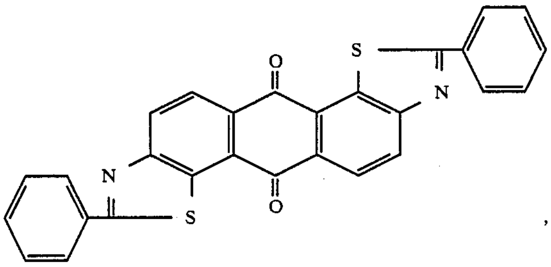

,

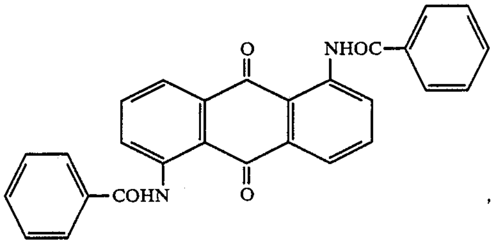

,

-continued
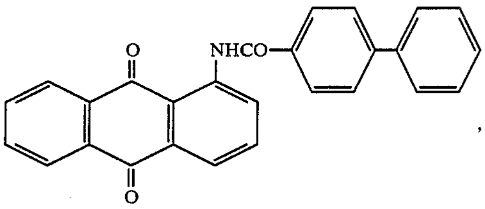,
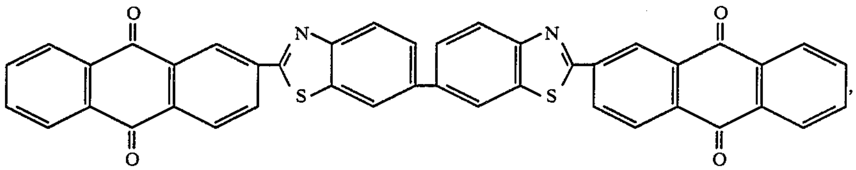,
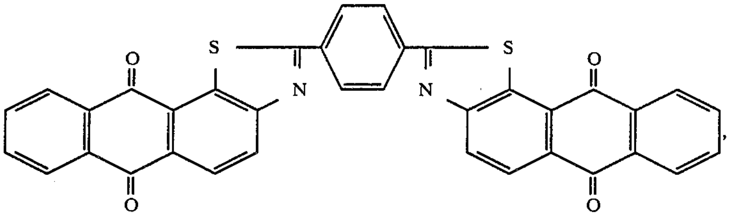,
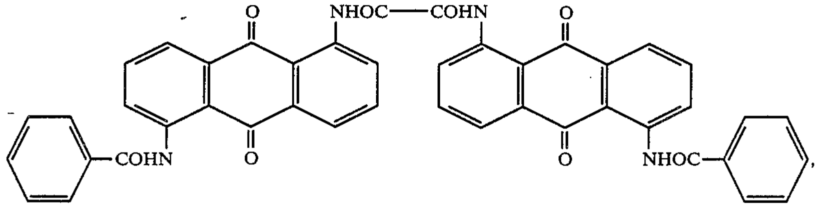,
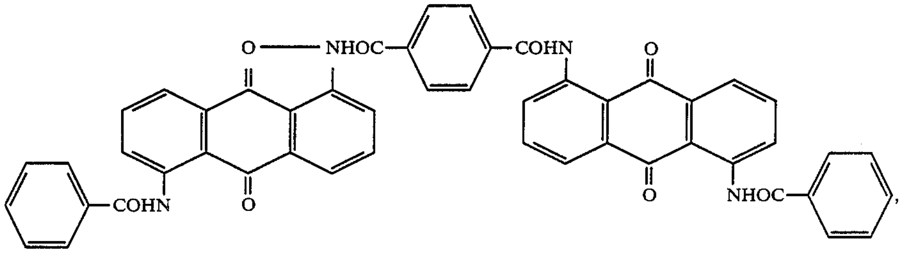,
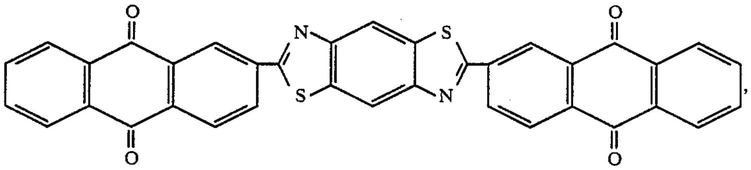,
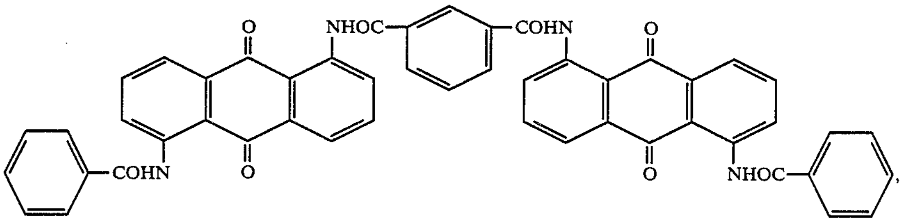, -continued

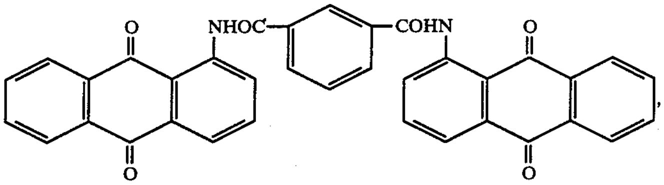

,

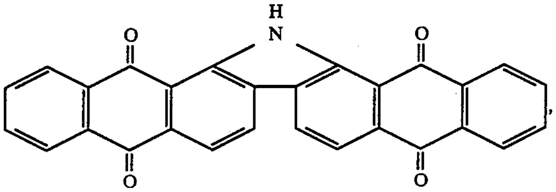

,

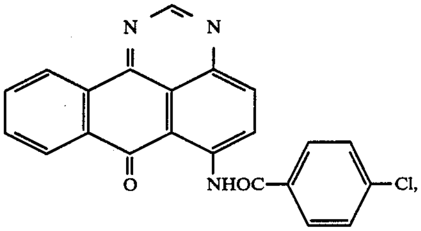

,

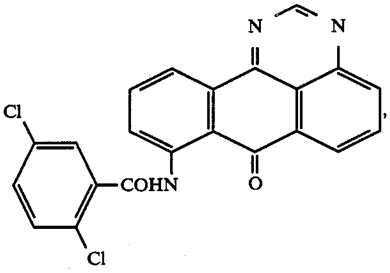

,

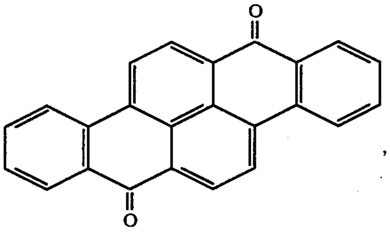

, and

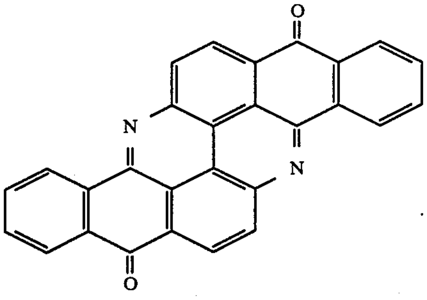

Examples of commercially available products of such anthraquinone type colorants are set forth below in terms of trade names.

Chromophthal Yellow 2AR (produced by Ciba Geigy) C.I. No. 70600, Heliofast Yellow E3R (produced by BAYER), Paliogen Yellow L1560 (produced by BASF) C.I. No. 68420, Kayaset Yellow E-R (produced by Nippon Kayaku) C.I. No. 65049, Chromophthal Yellow AGR (produced by Ciba Geigy), Bayplast Yellow E2G (produced by BAYER), Nihonthrene Yellow GCN (produced by Sumitomo Kagaku) C.I. No. 67300, Mikethrene Yellow GK (produced by Mitsui Toatsu) C.I. No. 61725, Indanthrene Printing Yellow GOK (produced by Hoechst) C.I. No. 59100, Anthrazol Yellow V (produced by Hoechst) C.I. No. 60531, Mikethrene Soluble Yellow 12G (produced by Mitsui Toatsu) C.I. No. 60605, Mikethrene Yellow GCF (produced by Mitsui Toatsu) C.I. No. 66510, Nihonthrene Yellow GCF (produced by Sumitomo Kagaku) C.I. No. 65430, Indanthrene Yellow 3G (produced by BAYER) C.I. No. 65005, Nihonthrene Yellow 4GL (produced by Sumitomo Kagaku), Indanthrene Yellow 5GK (produced by BAYER) C.I. No. 65410, Palanthrene Yellow PGA (produced by BASF) C.I. No. 68400, Cibanone Yellow 2G (produced by Ciba Geigy), Indanthrene Yellow F2GC (produced by Hoechst), Anthrazole Yellow IGG (produced by Hoechst), Indanthrene Yellow 5GF (produced by BASF), Mikethrene Yellow 3GL (produced by Mitsui Toatsu), Indanthrene Yellow LGF (produced by BASF), Monolite Yellow FR (produced by ICI), and Kayaset Yellow E-AR (produced by Nippon Kayaku).

As for the isoindolinone type colorant, the aromatic fused polyciclic structure of its basic skelton is thermally very stable and free of decomposition even when heated, having a property of being readily vaporized above a certain temperature, and hence very suitable for formation of a thin film of colorant by vapor deposition. The thin film of the isoindolinone type colorant and the thin film of the anthrequinone type colorant are not sparse as frequently seen in organic films but very dense, and yet closely adhering to the surface of an inorganic material such as glass, thus having excellent properties as vapor-deposited film.

On the other hand, these deposited films have excellent resistance to organic solvents. That is, they are substantially insoluble in poor solvents such as alcohols, as a matter of course, and also in good solvent such as ketones, ester, ether alcohols, halides, etc., without causing any change in spectral characteristics. Accordingly, there occurs no trouble even when coating of a resist or development may be applied, whereby minute working of the colorant layer can be done with ease as suitable for production of minute color filters.

The thickness of the green colorant layer of the color filter of the present invention may be determined depending on the spectral characteristic and generally from 500 to 10000 Å.

When the green colorant layer of the color filter of the present invention is provide by a combination of an octa-4,5-phenylphthalocyanine type colorant and an isoindolinone or anthrequinone type colorant, the green colorant layer is generally formed according to the method in which the octa-4,5-phenylphthalocyanine type colorant and the isoindolinone or anthraquinone type colorant are successively laminated by vapor deposition, but mixing vapor deposition or simultaneous vapor deposition may also be available. The film thicknesses or amounts of vapor deposition can be controlled depending on the desired spectral characteristics. When the octa-4,5-phenylphthalocyanine type colorant and the isoindolinone or anthraquinone type colorant are successively laminated by vapor deposition, each film thickness may ordinarily adequately be 500 to 10000 Å.

When the green colorant layer is to be formed of the octa-4,5-phenylcyanine type colorant and the isoindolinone or anthraquinone type colorant, the ratio of the octa-4,5-phenylphthalocyanine colorant and the isoindolinone or anthr quinone type colorant should preferably be such that the latter be 1 to 5 parts by volume per one part by volume of the octa-4,5-phenylphthalocyanine type colorant.

Next, patterning of the vapor-deposited colorant layer in order to form the color filter of the present invention will be described.

As the patterning techniques for vapor-deposited layers, there are typically used the dry etching method and the lift-off method.

The dry etching method comprises providing a resist pattern with a shape corresponding to the pattern to be formed on a vapor-deposited colorant layer provided on a substrate such as that of glass, etc., utilizing it as the mask and removing the portions other than the portion covered with the mask of the deposited layer by plasma or ion etching thereby to form a colorant pattern (Japanese Laid-Open Patent Application No. 34961/1983, etc.). According to this method, formation of an intermediate layer as required in the dyeing method is not necessary, but instead a resist mask will remain on the colorant pattern. Moreover, since it is very difficult to remove the mask without giving any damage to the colorant layer, there consequently results in a two layer structure in which an optically unnecessary resist mask is laminated on the colorant layer.

On the other hand, according to the lift-off method, for example, a resist pattern with a shape corresponding to the pattern to be formed is provided on a substrate with the use of, for example, a resist, and then a colorant layer is deposited on the substrate having this resist pattern provided thereon. Thus, on the substrate, there is obtained a condition in which a resist pattern is formed beneath the colorant layer to be removed. Next, the substrate is processed with a developing solution, whereby the resist patterns dissolved away or peeled off from the substrate. In this case, the colorant layer existing on the resist pattern is also removed from the substrate, and the portion of the colorant layer laminated directly on the substrate remains on the substrate to effect patterning of the vapor-deposited layer. Thus, according to the lift-off method, unnecessary portions of the vapor deposited colorant layer can be removed physically without having any direct action on the vapor-deposited colorant layer on the substrate.

The resist to be used in patterning of the colorant layer according to the lift-off method may be either a negative type or a positive type, provided that it can be peeled off or dissolved away from the substrate during later processing for removal from the substrate with a developing solution. However, in the negative type, crosslinking may generally proceed by irradiation of a radiation and a solvent having a strong dissolving power is required for dissolution. Therefore, it is not preferred because the colorant layer can be damaged by or dissolved in such a solvent.

In this respect, a positive type resist is suitable for lift-off as compared with a negative-type resist, because the resist becomes soluble in a developing solution by exposure a radiation on the entire surface thereof particularly after formation of a resist pattern, and therefore a solvent which does not readily dissolve the colorant can be selected. Also, since the positive type resist is inclusive of a variety of kinds of the resins components, various solvents may be used for coating or developing thereof. It is desirable to select a positive type resist for which a solvent with little action on the colorant can be used, and as an example, a fluorine-containing methacrylate represented by the formula shown below may preferably be used. This is because the resist can be dissolved in good solvents having a high solubility such as ester, aromatics, halogenated hydrocarbons, as a matter of course, but also in poor solvents having a low solubility such as alcohols as well, whereby a solvent having little influence on the colorant film can be used.

Commercially available resists of this type may include FPM 210, FBM 100 and FBM 120 (all being trade names, produced by Daikin Kogyo).

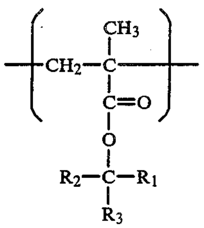

wherein $R_1$ an $R_2$ each represent hydrogen, or an alkyl group, and $R_3$ is an alkyl group in which at least one fluorine is bonded to each carbon atom.

Typical examples of combinations of $R_1$, $R_2$ and $R_3$ may include those shown in the following table:

| $R_1$ | $R_2$ | $R_3$ |
|---|---|---|
| H | H | $-CF_2-CF_2H$ |
| $CH_3$ | $CH_3$ | |
| H | H | $-CF_2-CFH-CF_3$ |
| H | $CH_3$ | |
| H | $C_2H_5$ | |
| H | $C_3H_7$ | |
| $CH_3$ | $CH_3$ | |
| $CH_3$ | $C_2H_5$ | |
| H | $H_2$ | $-CF_2-CF_2-CF_2-CF_2H$ |

-continued

| $R_1$ | $R_2$ | $R_3$ |
|---|---|---|
| $CH_3$ | $CH_3$ | |

As other resists, various kinds of materials commercially sold under the trade names shown below may be conveniently used.

AZ series: 111, 119A, 120, 340, 1350B, 1350J, 1370, 1375, 1450, 1450J, 1470, 1475, 2400, 2415, 2430 (produced by Shipley Co.);

Waycoat: HPR-204, HPR-205, HPR-206, HPR-207, HPR-1182, Waycoat:MPR (produced by Hunt Co.);

Kodak Micro Positive Resist 809 (produced by Kodak Co.);

Isofine Positive Resist (Microimage Technology Co.);

PC 129, 129SF (produced by Polychrome Co.);

OFPR II: 77, 78, 800, OEBR: 1000, 1010, 1030, ODUR: 1000, 1001, 1010, 1013, 1014 (produced by Tokyo Oka);

EBR: 1, 9 (produced by Toray);

FMR: E100, E101 (produced by Fuji Yakuhin Kogyo);

JSR Positive Photoresist PFR 3003 (produced by Nippon Gosei Gomu Co.); and

Selectilux P (produced by Merck Co.).

After carrying out patterning of the deposited colorant layer according to the patterning step as described and repeating formation of a vapor-deposited colorant layer and patterning thereof for each color of the color filter to form patterned colorant layers of predetermined plural number of colors, it is desirable to provide a protective film on these colorant layers. This is provided for preventing the colorant layers from defects such as attachment of dust or flaws, and also protect the colorant layers from various environmental conditions.

The material which can form a protective film for the colorant layer may include, for example, organic resins such as polyurethane, polycarbonate, silicone, acryl, poly-p-xylene, etc., inorganic films such as those of $Si_3N_4$, $SiO_2$, SiO, $Al_2O_3$, $Ta_2O_3$, etc., and a protective layer can be formed from the material selected from these according to the coating method such as spin coating, dipping, roll coating, etc., or the vapor deposition method. For formation of the protective layer, various kinds of photosensitive resins, for example, various resists may be available.

Patterning of the deposited colorant layer as described above can be performed on an appropriate substrate, and the substrate to be used is not particularly limited, provided that the colorants can be deposited thereon and the color filter formed has the desired function.

For example, the following materials may be specifically used as the substrate. That is, glass plate, resin plate for optical use, gelatin, film or plate of a resin such as polyvinyl alcohol, hydroxyethyl cellulose, methyl methacrylate, polyester, butyral, polyamide, etc., may be employed. Alternatively, it is also possible to form a patterned colorant layer integrated with one to be applied as the color filter. In that case, examples o the substrate may include Brown tube display surfaces, light-receiving surfaces of image pick-up tube, wafer having solid state image pickup device such as CCD, BBD, CID, BASIS, etc., formed thereon, contact type image sensors employing a thin film semiconductor such as that of a-Si (amorphous silicon), etc., liquid crystal display surfaces, photosensitive members for color electrophotography, etc.

When it is necessary to increase adhesion between the colorant layer and the base substrate, for example, a glass plate, it is effective to form the deposited colorant layer after coating the glass plate, etc. with a thin layer of a polyurethane resin, a polycarbonate resin, a silane coupling agent, etc.

Referring now to the drawings, a process for forming the color filter of the present invention according to lithography is described about an example of the case of forming a green stripe filter.

First, a positive type resist is applied by rotatory coating by a spinner on a desired substrate. After drying, the resist layer is prebaked under appropriate temperature conditions. Then, the resist layer is exposed to light through a mask having a pattern shape corresponding to the pattern to be formed (stripe pattern), and further developed to form a resist pattern. If desired, before development, pre-treatment for the purpose of alleviating distortion of the resist film and, after development, rinsing treatment for the purpose of suppressing swelling may also be conducted. When the residual film of the resist or the residue of so-called scum cannot be completely removed by developing, it can be removed according to the plasma ashing method.

Figure 2:
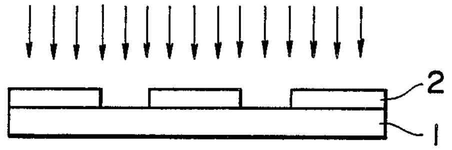

According to the steps as described above, a resist pattern 2 as shown in FIG. 1 is formed on the substrate 1. Then, light or electron beam to which the resist has a sensitivity is irradiated on the whole surface of the resist pattern 2 as shown in FIG. 2. This is done for making easier removal of the resist pattern by dissolution in the later step by effecting cleavage of the main chain or decomposition of the resist, but it is possible to omit this step. When omitted, it is necessary to employ a solvent with a stronger dissolving power as much.

Figure 3:
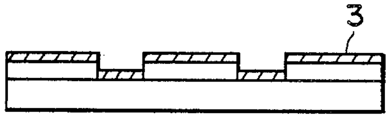

Subsequently, as shown in FIG. 3, on the surface of the substrate 1 provided with the resist pattern, octa-4,5-phenylphthalocyanine or its metal complex as previously mentioned is vapor-deposited according to the vacuum vapor deposition method to form a colorant layer 3.

The thickness of the colorant layer may be determined on the desired spectral characteristics, but generally about 500 to 10000 Å.

Next, the substrate having the colorant layer 3 provided thereon is dipped in a solvent capable of dissolving away or peeling off only the resist pattern 2 without dissolving the colorant or imparing the spectral characteristics in order to remove the resist pattern 2 beneath the colorant layer.

Figure 4:
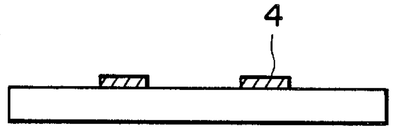

Simultaneously with removal of the resist pattern, the colorant layer lying thereon is removed, and it is effective for aiding removal to apply an energy of ultrasonic wave at the time of dipping. Thus, a green colorant layer 4 with a stripe pattern as shown in FIG. 4 can be formed to provide a color filter of the present invention.

Figure 5:
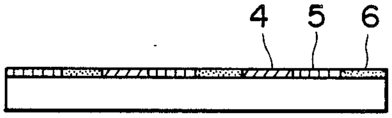

When a color filter of the present invention comprising two or more colors, further the steps as described with reference to FIG. 1 to FIG. 4 can be repeated as desired, namely depending on the number of the colors of the filter to be used, by use of the colorants corresponding to the respective colors, whereby, for example, a color filter comprising color layers 4, 5 and 6 of three different colors as shown in FIG. 5 is provided.

Figure 6:
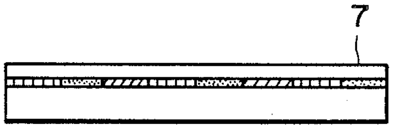

Also, the color filter of the present invention may have a protective layer 7 formed of a material as mentioned above on the upper part of the filter as shown in FIG. 6.

According to the present invention, since the color layer is excellent in heat resistance and solvent resistance, and also formed by vapor-deposition of a colorant excellent in spectral characteristics, a color filter could be provided which is excellent in manufacturability such as adaptability to formation of the colorant layer by vapor deposition or patterning of the vapor-deposited colorant layer as well as in optical functions of the color filter formed. Particularly, since a colorant excellent in heat resistance, solvent resistance and also in spectral characteristics is used in the green colorant layer for which desired spectral characteristics could not be easily obtained in the prior art, the green color layer of the color filter can be formed according to the vapor deposition method and has desired spectral characteristics.

Also, by color correction of the blue component slightly contained in the octa-4,5-phenylphthalocyanine type colorant with isoindolinone type colorant or anthrequinone type colorant, it can be used as a strict green colorant layer.

Hereinbelow, the present invention will be explained with reference to working examples.

EXAMPLE 1

On a glass substrate, a positive-type resist ODUR 1013 (produced by Tokyo Oka K.K.) was applied by spinner coating to a film thickness of 1.0 $\mu$m. Next, after the resist layer was prebaked at 120° C. for 20 minutes, the resist layer was further exposed through a pattern mask corresponding to the pattern desired to be formed by use of far-UV rays. After completion of exposure, the resist layer on the substrate was treated with a developing solution and a rinsing solution prescribed for the resist to form a resist pattern on the substrate. Next, far UV-rays were irradiated on the entire surface of the resist pattern so that the resist pattern might become readily soluble in a developing solution during a lift-off treatment with the developing solution to be performed later.

Subsequently, the glass substrate having a resist pattern formed thereon and a vapor deposition boat made of molybdenum filled with copper octa-4,5-phenylphthalocyanine were placed at predetermined positions in a vacuum vessel, and the vacuum vessel was evacuated internally. At a vacuum of $10^{-5}$–$10^{-6}$ torr, the boat was heated to 450° to 550° C., whereat vapor deposition layer of copper octa-4,5-phenylphthalocyanine was formed on the substrate having the resist pattern thereon to a thickness of about 3000 Å.

Finally, by removing the unnecessary portion on the vapor-deposited colorant layer while dissolving the resist pattern by dipping with stirring the glass substrate after completion of vapor deposition in the developing solution for exclusive use for resist previously employed, the green colorant layer on the substrate was subjected to patterning in the form of stripes to obtain a color filter of the present invention.

Even after a series of these steps, the vapor-deposited layer on the substrate suffered from no damage at all, and substantially no lowering in spectral characteristics of the vapor-deposited colorant layer was recognized.

Figure 7:
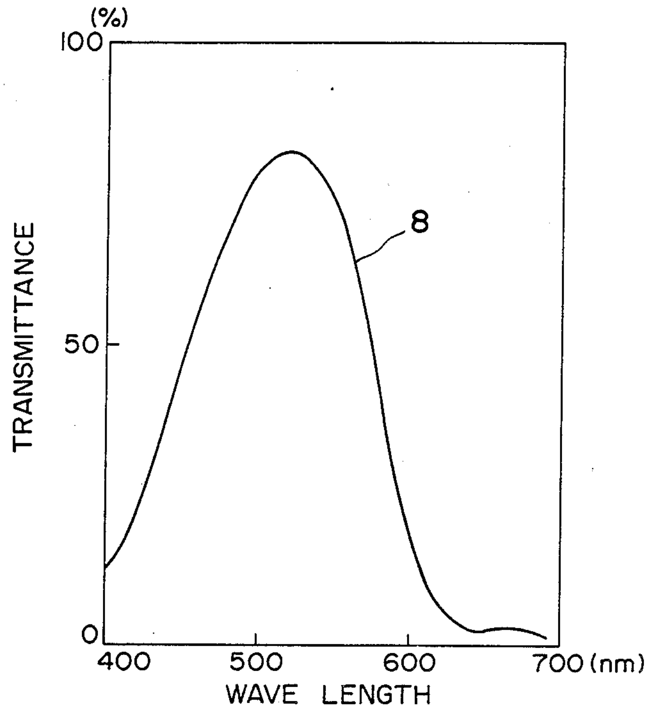
FIG. 7 is a graph showing the spectral transmittance through the green colorant layer of a color filter of the present invention.

The spectral characteristics of the green colorant layer obtained are shown by the curve 8 in FIG. 7. As shown in this Figure, excellent spectral characteristics of green color were obtained.

EXAMPLE 2

On the substrate having the green stripe filter formed thereon in Example 1, a resist layer was formed and exposed to light by use of a pattern mask corresponding to the shape of a blue stripe pattern, and further following the same procedure as in Example 1 except for using Cu phthalocyanine as the colorant for formation of the vapor-deposited layer, a blue stripe pattern was formed at a predetermined position on the substrate.

Formation of the vapor-deposited layer comprising Cu phthalocyanine was practiced by evacuating the vacuum vessel to a vacuum of $10^{-5}$ to $10^{-6}$ torr, heating the vapor-deposition boat to 450° to 550° C. to deposit the layer to a thickness of about 2000 Å.

Further, on the substrate having these green and blue stripe patterns formed thereon, exposure of the resist was effected by use of a pattern mask corresponding to the shape of a red stripe pattern, and except for using Irgadine Red BPT (trade name, produced by Ciba Geigy, C.I. No. 71127) as the colorant for formation of the vapor-deposited colorant layer and carrying out vapor deposition of the colorant by evacuating the vacuum vessel to $10^{-5}$ to $10^{-6}$ torr, heating the vapor deposition boat to 450° to 550° C. to deposit the layer to a thickness of about 2000 Å, the same procedure as in Example 1 was repeated to form a red stripe pattern at a predetermined position on the substrate, thereby obtaining a colored pattern of three color stripes.

In the steps for forming a colored pattern as described above, the blue and red colorant layers, as a matter of course, also the green colorant layer was not dissolved at all in the development processing, and not deteriorated even after the heat treatment step without impairing the spectral characteristics.

Finally, as a protective film of a rubbery resin, a commercially available negative resist ODUR WR (trade name, produced by Tokyo Oka) was applied on the colored pattern of three color stripes, and the film was hardened by prebaking and exposure over the entire surface to complete a tricolor stripe color filter of the present invention.

Figure 8:
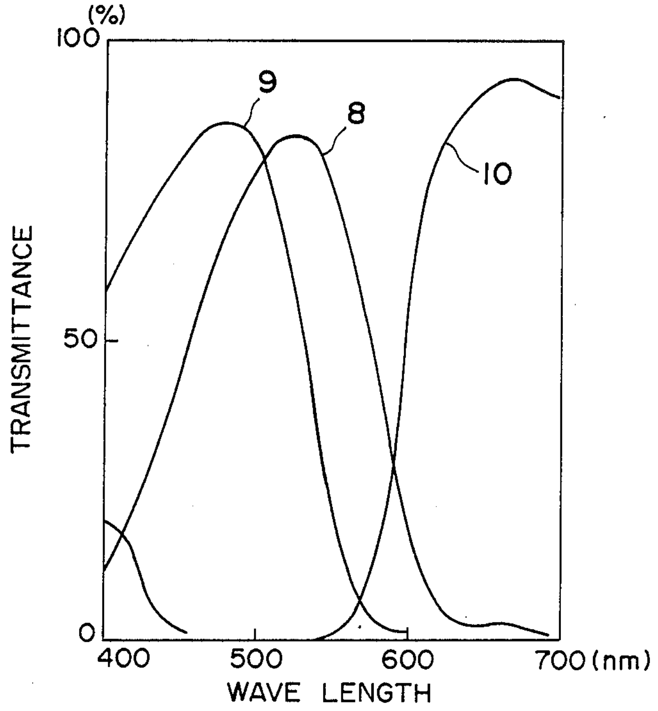
FIG. 8 is as graph showing the spectral transmittance of the colorant layer possessed by the color filter of the present invention obtained in Example 2.

The spectral characteristics of the tricolor color filter thus formed are shown in FIG. 8, in which the curve 9 shows the spectral characteristics of the blue colorant layer and the curve 10 those of the red colorant layer.

EXAMPLE 3

With the use of a substrate provided with thin film transistors, preparation of a color liquid display device comprising a color filter of the present invention on the substrate was practiced as described below.

Figure 9:
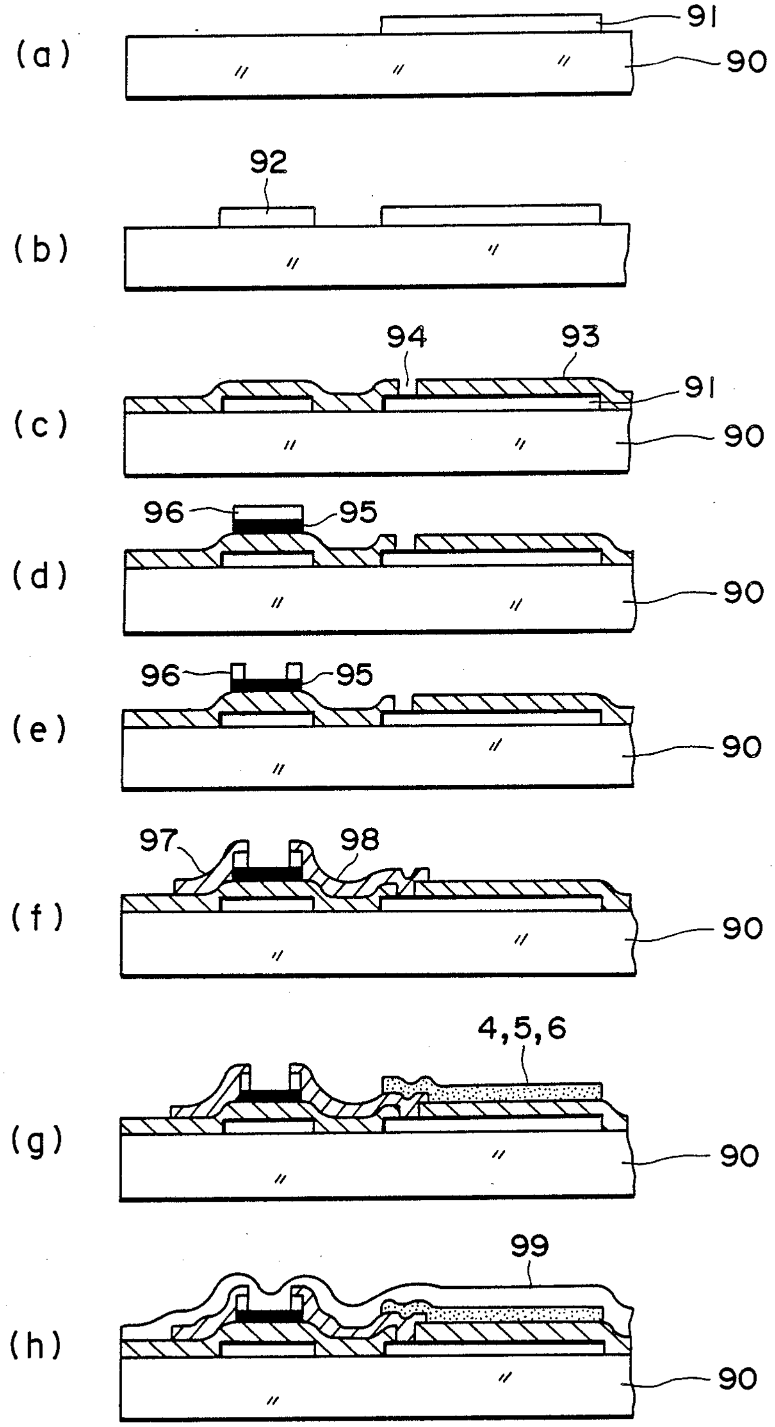
FIGS. 9(*a*)–(*h*) show steps of the process for preparing a color liquid crystal display device having a color filter of the present invention.

First, as shown in FIG. 9(*a*), on a glass substrate (trade name: 7059, produced by Corning Co. 90, an I.T.0. (indium tin oxide) picture element electrodes 91 with a layer thickness of 1000 Å was formed according to photolithography to a desired pattern, then aluminum was further vapor-deposited under vacuum on this surface to a thickness of 1000 Å and the deposited layer was subjected to patterning to a desired shape according to photolithography to form a gate electrode 92 as shown in FIG. 9(*b*).

Subsequently, a photosensitive polyimide (trade name: Semicofine, produced by Toray) was applied on the surface of the substrate 90 having the above electrode provided thereon to form an insulating layer 93, followed by pattern exposure and development processing, to form a through-hole 94 constituting a contact portion between a drain electrode 98 (FIG. 9(*f*)) and a picture element electrode 91 as shown in FIG. 9(*c*).

Here, the substrate 90 was set at a predetermined position in the deposition vessel, $SiH_4$ diluted with $H_2$ was introduced into the deposition vessel and a photoconductive layer (intrinsic layer) 95 comprising a-Si with a layer thickness of 2000 Å was deposited according to the glow discharge method in vacuum on the surface of the substrate having the above electrodes 91, 92 and the insulating 93 provided thereon. Then, on the photoconductive layer 95, an $n^+$ layer 96 in a thickness of 1000 Å was laminated as shown in FIG. 9(*d*) following the same operation. The substrate 90 was taken out from the deposition vessel, and the above $n^+$ layer 96 and photoconductive layer 95 were subjected, respectively, in this order to patterning to desired shapes as shown in FIG. 9(*e*) according to dry etching.

Next, after aluminum was vapor-deposited under vacuum to a layer thickness of 1000 Å on the substrate surface having the photoconductive layer 95 and the $n^+$ layer 96 provided thereon, the aluminum vapor-deposited layer was subjected to patterning to a desired shape according to photolithography to form a source electrode 97 and a drain electrode 98 as shown in FIG. 9(*f*).

Finally, after a tricolor colored pattern of red, blue and green was formed as shown in FIG. 9(*g*) in the same manner as in Example 2, corresponding to each picture element electrode 91, the entire surface of the substrate was coated with a polyimide resin as the insulation film 99 endowed with the orientation function to a layer thickness of 1200 Å and the resin was cured by the heat treatment at 250° C. for one hour to prepare a thin film transistor integrated with a color filter.

By use of the thin film transistor equipped with a color filter thus prepared, a liquid crystal display device was further formed.

That is, on one surface of a glass substrate (trade name: 7059, produced by Corning Co.), in the same manner as described above, an I.T.O. electrode layer with a thickness of 1000 Å was formed, and further on said electrode layer was formed an insulation layer with a thickness of 1200 Å comprising a polyimide resin endowed with the orientation function. Between this substrate and the thin film transistor equipped with a color filter previously formed, a liquid crystal was sealed and the whole assembly was fixed to obtain a liquid crystal color display device.

The liquid crystal color display device thus formed showed good operation characteristics, and the same effects as in Example 1 and Example 2 could be obtained in formation of the color filter.

EXAMPLE 4

In place of providing a tricolor color filter on the picture element electrode, it was provided on the counter-electrode, and, following otherwise the same procedure as in Example 3, a liquid crystal color display device having a color filter of the present invention was obtained.

The liquid crystal color display device thus formed showed good operation characteristics, and the same effects as in Example 1 and Example 2 could be obtained in formation of the color filter.

EXAMPLE 5

Except for using a wafer having a CCD (charge coupled device) thereon as the substrate and forming a tricolor stripe color filter so that the respective colored patterns of the color filter may be arranged corresponding to the respective light-receiving cells of the CCD, in the same manner as in Example 2, a color solid image pick-up device having a color filter of the present invention was formed.

The color solid image pick-up device thus formed showed good operation characteristics, and the same effects as in Example 1 and Example 2 could be obtained in formation of the color filter.

EXAMPLE 6

On a wafer having a CCD formed thereon, the color filter formed in Example 2 was plastered with registration so that the respective colored patterns of the color filter were arranged corresponding to the respective light-receiving cells of the CCD to form a color solid image pick-up device.

The color solid image pick-up device thus formed showed good operation characteristics, and the same effects as in Example 1 and Example 2 could be obtained in formation of the color filter.

EXAMPLE 7

Figure 10:
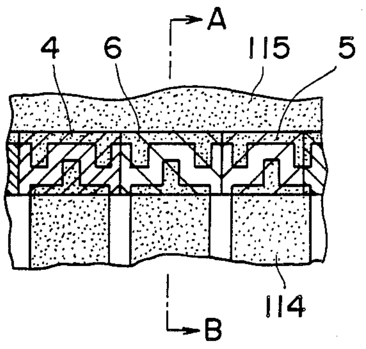
FIG. 10 is a schematic plan view of a color photosensor array having a color filter of the present invention.
Figure 11:
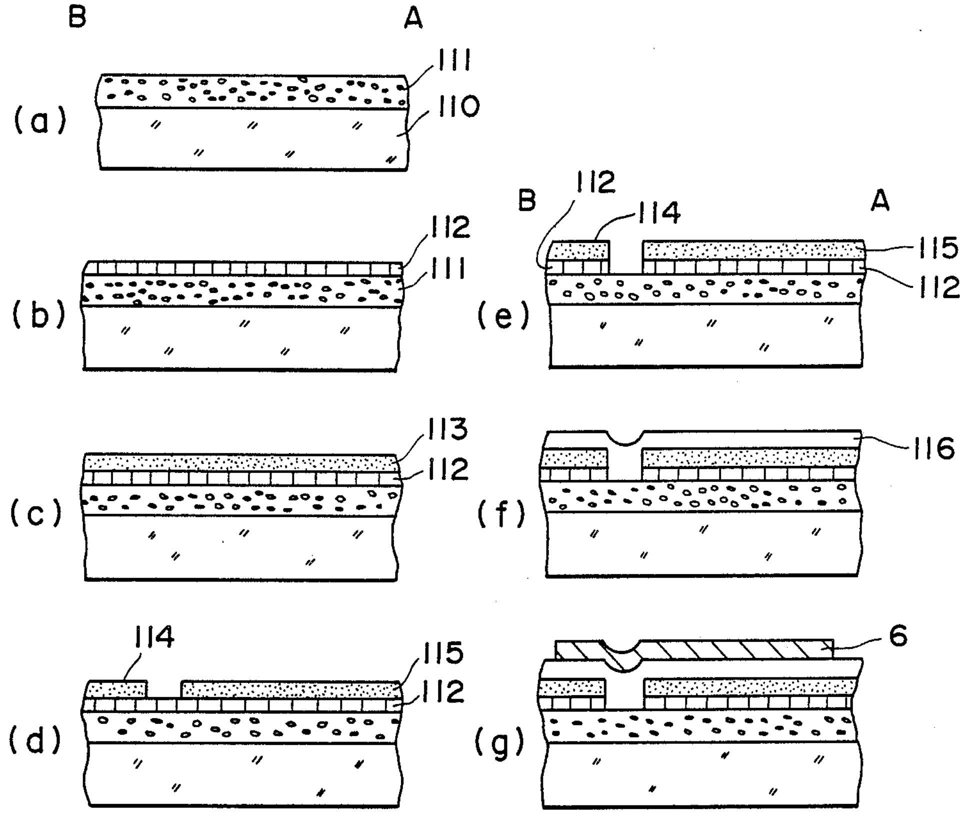
FIGS. 11(*a*)-(*g*) show steps for forming a color photosensor array shown in FIG. 10.

A color photosensor array as schematically shown in a partial plan view in FIG. 10 was formed following the steps as shown in FIG. 11 as described below. FIG. 11(*a*)–(*g*) show sectional views taken along the line A-B of the photosensor array shown in FIG. 10.

First, on a glass substrate (trade name: 7059, produced by Corning Co.) 110, a photoconductive layer (intrinsic layer) 111 comprising a-Si (amorphous silicon) layer was provided according to the glow discharge method as shown in FIG. 11(*a*).

More specifically, $SiH_4$ diluted to 10 vol. % with $H_2$ was deposited on the substrate under a gas pressure of 0.50 Torr, with a RF (radio Frequency) power of 10 W, at a substrate temperature of 250° C. for 2 hours, whereby a photoconductive layer 111 with a layer thickness of 0.7 μm was obtained.

Subsequently, on the photoconductive layer 111, an $n^+$ layer 112 was provided according to the glow discharge method as shown in FIG. 11(*b*).

More specifically, except for using a gas mixture comprising $SiH_4$ diluted to 10 vol. % with $H_2$ and $PH_3$ diluted to 100 ppm with $H_2$ at a ratio of 1:10 as the starting material, under the same conditions for deposition of the photoconductive layer previously described, an $n^+$ layer 112 with a layer thickness of 0.1 μm was provided continuous to the photoconductive layer 111.

Next, as shown in FIG. 11(*c*), aluminum was deposited according to the electron beam vapor deposition method to a layer thickness of 0.3 μm on the $n^+$ layer 112 to laminate an electroconductive layer 113 thereon. Subsequently, as shown in FIG. 11(*d*), the portion corresponding to the photoconverting portion of the electroconductive layer 113 was removed.

More specifically, after a photoresist pattern was formed to a desired shape by use of a positive type Microposit 1300-27 (trade name, produced by Shipley Co.) photoresist, the electroconductive layer 113 at the exposed portion (the portion where no resist pattern is provided) was removed with an etchant comprising a mixture of phosphoric acid (85 vol. % aqueous solution), nitric acid (60 vol. % aqueous solution), glacial acetic acid and water at a ratio of 16:1:2:1 to form a common electrode 115 and individual electrodes 114.

Next, the $n^+$ layer at the portion corresponding to the photoconverting portion was removed as shown in FIG. 11(*e*).

More specifically, after the above Microposit 1300-27 photoresist was peeled off from the substrate, dry etching was effected with $CF_4$ gas according to the plasma etching method (alternatively called the reactive ion etching method) by means of a parallel flat plate type plasma etching device DEM-451 (produced by Nichiden Unelva K.K.) under the conditions of RF power of 120 W and gas pressure of 0.1 Torr for 5 minutes to remove the $n^+$ layer 112 at the exposed portion and a part of the surface layer of the photoconductive layer 111.

In this Example, for prevention of implantation of the cathode material of the etching device, a target for sputtering of polysilicon (8 inches, purity 99.999%) was placed on the cathode, a sample was mounted thereon and the portion where the cathode material SUS was exposed was covered with a Teflon sheet cut in shape of a doughnut so that etching was conducted under the state with the SUS surface being not substantially exposed to plasma. Then, heat treatment was conducted at 20° C. for 60 minutes in an oven through which nitrogen was passed at a rate of 3 liters/min.

On the surface of the photosensor array thus prepared, a protective layer was then formed in the following manner.

That is, a silicon nitride layer 116 as the protective layer was formed according to the glow discharge method on the photosensor array.

More specifically, in the same manner as in formation of the previous a-Si layer, except for using a gas mixture of $SiH_4$ diluted to 10 vol. % with $H_2$ and 100% $NH_3$ mixed at a flow rate ratio of 1:4, a silicon nitride (a-SiNH) layer 116 was formed as shown in FIG. 11(*f*).

Further, with the use of the protective layer 116 as the substrate, a color filter comprising a tricolor colored pattern of blue 5, green 4 and red 6 was formed in the same manner as in Example 2, and a color photosensor array having the colored filters arranged on the photosensors, respectively, was formed.

Also in the color photosensor array formed in this Example, the same effects as obtained in Examples 1 and 2 could be obtained during formation of the color filter, and the color photosensor obtained was found to show good operation characteristics.

EXAMPLE 8

A color photosensor array was formed by plastering the color filter formed in Example 2 on the photosensor array formed in Example 7 with an adhesive.

The color photosensor formed in this Example was also found to show good operation characteristics similarly as that formed in Example 7.

EXAMPLE 9

A glass substrate having the same resist pattern as in Example 1 formed thereon and a vapor deposition boat made of molybdenum filled with Fastgen Super Yellow GROH (trade name, produced by Dainippon Ink, C.I. name: Pigment Yellow 137) as the isoindolinone type colorant were placed at predetermined positions in a vacuum vessel, and the vacuum vessel was evacuated internally. At a vacuum of $10^{-5}$–$10^{-6}$ torr, the vapor deposition boat was heated to 450° to 500° C., whereat vapor deposition layer of Fastgen Super Yellow GROH was formed on the substrate having the resist pattern thereon to a thickness of about 4000 Å.

According to the same method, copper octa-4,5-phenylphthalocyanine was vapor-deposited to a thickness of about 2000 Å.

Finally, by removing the unnecessary portion on the vapor-deposited colorant layer while dissolving the resist pattern by dipping with stirring the glass substrate after completion of vapor deposition in a developing solution prescribed for the resist as employed in Example 1, the green colorant layer on the substrate was subjected to patterning in stripes to obtain a color filter of the present invention.

Figure 12:
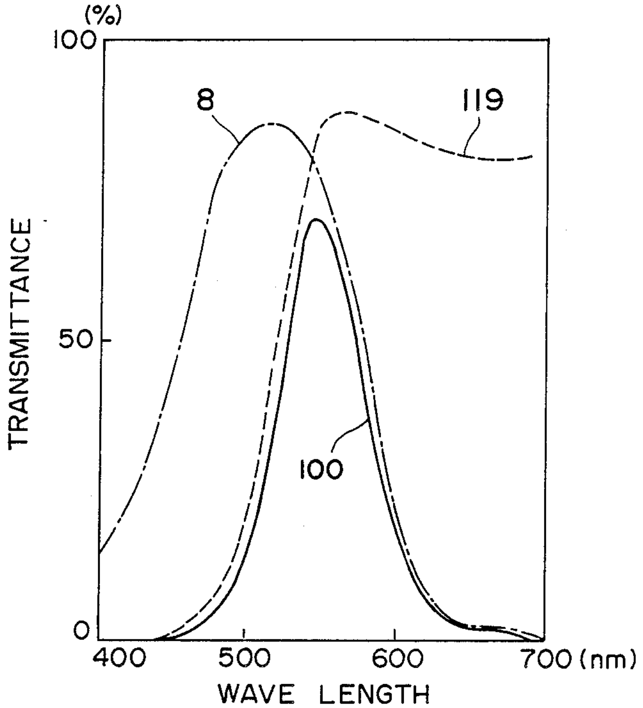
FIG. 12 is a graph showing the spectral transmittance of a colorant layer of a color filter of the present invention obtained in Example 9.

The spectral characteristics of the green colorant layer obtained are shown by the curve 100 in FIG. 12. As shown in this Figure, by correction with Fastgen Super Yellow GROH (curve 119), excellent spectral characteristics of green color improved on the blue side as compared with the characteristics of copper octa-4,5-phenylphthalocyanine alone (curve 8) were obtained.

EXAMPLES 10–12

The isoindolinone type yellow colorant was changed to the following colorants and, following otherwise the same procedure as in Example 9, color filters of the present invention were prepared.

Kayaset Yellow - E-2RL (produced by Nippon Kayaku, C.I. name: Pigment Yellow 110) . . . Example 10

Kayaset Yellow - E-3RL176 (produced by Nippon Kayaku, C.I. name: Pigment Yellow 110) . . . Example 11

Irgadine Yellow - 3RLTN (produced by Ciba Geigy, C.I. name: Pigment Yellow 110) . . . Example 12

In any case, a patterned green color layer improved in spectral characteristics similarly as in the case of Example 9 was obtained.

EXAMPLE 13

On the glass substrate of Example 9 having the green stripe filter formed thereon, a blue stripe pattern, a red stripe pattern and a protective film were formed to complete a tricolor stripe color filter of the present invention.

Figure 13:
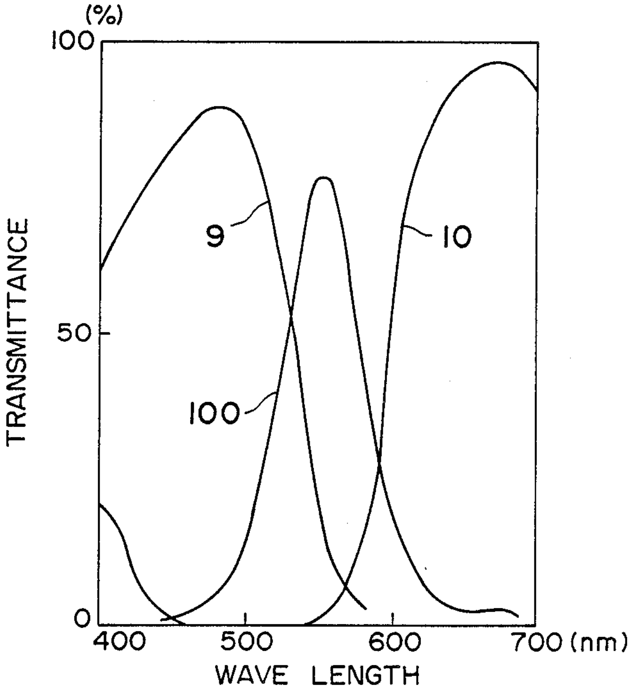
FIG. 13 is a graph showing the spectral transmittance of a colorant layer of a color filter of the present invention obtained in Example 13.

The spectral characteristics of the tricolor color filter thus formed are shown in FIG. 13, in which the curve 9 shows the spectral characteristics of the blue stripe pattern and the curve 10 shows the spectral characteristics of a red stripe pattern.

EXAMPLE 14

With the use of a thin film transistor as the substrate, a color liquid crystal display device comprising the color filter of Example 13 formed on said substrate was prepared in the same manner as in Example 3.

The liquid crystal display device for color thus formed showed good operation characteristics and, as to the spectral characteristics of the color filter, the same effect as in Examples 9 and 13 was obtained.

EXAMPLE 15

In place of providing a tricolor color filter on the picture element electrode, it was provided on the counter-electrode, and, following otherwise the same procedure as in Example 14, a liquid crystal display device for color having a color filter of the present invention was obtained.

The liquid crystal display device for color thus formed showed good operation characteristics, and the same effects as in Example 9 and Example 13 could be obtained with respect to spectral characteristics of the color filter.

EXAMPLE 16

Except for using a wafer having a CCD (charge coupled device) thereon as the substrate and forming a tricolor stripe color filter so that the respective colored patterns possessed by the color filter may be arranged corresponding to the respective light-receiving cells of the CCD, in the same manner as in Example 14, a color solid image pick-up device having a color filter of the present invention was formed.

The color solid image pick-up device thus formed showed good operation characteristics, and the same effects as in Example 9 and Example 13 could be obtained with respect to spectral characteristics of the color filter.

EXAMPLE 17

On a wafer having a CCD formed thereon, the color filter formed in Example 13 was plastered with registration so that the respective colored patterns possessed by the color filter were arranged corresponding to the respective light-receiving cells of the CCD to form a color solid image pick-up device.

The color solid image pick-up device thus formed showed good operation characteristics, and the same effects as in Example 9 and Example 13 could be obtained with respect to spectral characteristics of the color filter.

EXAMPLE 18

Except for using the color filter of Example 13, a color photosensor array was prepared in the same manner as in Example 7.

Also in the color photosensor array formed in this Example, the same effects as obtained in Examples 9 and 13 could be obtained during formation of the color filter, and the color photosensor obtained was found to show good operation characteristics.

EXAMPLE 19

A color photosensor array was formed by plastering the color filter formed in Example 13 on the photosensor array formed in Example 18 with an adhesive.

The color photosensor formed in this Example was also found to show good operation characteristics similarly as that formed in Example 18.

EXAMPLE 20

A glass substrate having the same resist pattern as in Example 1 formed thereon and a vapor-deposition boat made of molybdenum filled with Chromophthal Yellow AGR (trade name, produced by Ciba Geigy, C.I. name: Pigment Yellow 147) as the anthraquinone type colorant were placed at predetermined positions in a vacuum vessel, and the vacuum vessel was evacuated internally. At a vacuum of $10^{-5}$–$10^{-6}$ torr, the vapor deposition boat was heated to 450° to 550° C., whereat vapor deposition layer of Chromophthal Yellow AGR was formed on the substrate having the resist pattern thereon to a thickness of about 4000 Å.

According to the same method, copper octa-4,5-phenylphthalocyanine was vapor deposited to a thickness of about 2000 Å.

Finally, by removing the unnecessary portion of the vapor-deposited colorant layer while dissolving the resist pattern by dipping with stirring the glass substrate after completion of vapor deposition in the developing solution prescribed for the resist as employed in Example 1, the green colorant layer on the substrate was subjected to patterning in stripes to obtain a color filter of the present invention.

Figure 14:
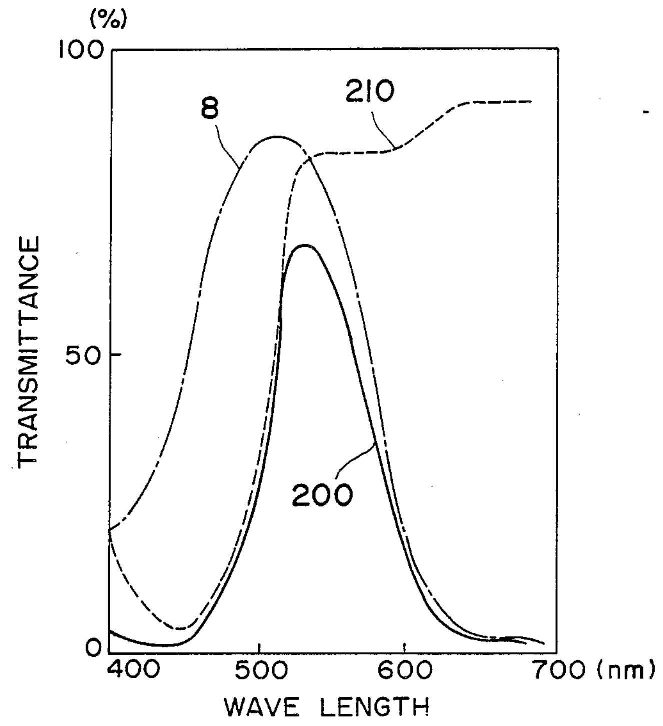
FIG. 14 is a graph showing the spectral transmittance of a colorant layer of a color filter of the present invention obtained in Example 19.

The spectral characteristics of the green colorant layer obtained are shown by the curve 200 in FIG. 14. As shown in this Figure, by correction with Chromophthal Yellow AGR (curve 210), excellent spectral characteristics of green color improved on the blue side as compared with the characteristics of copper octa-4,5-phenylphthalocyanine alone (curve 8) were obtained.

EXAMPLE 21

The anthraquinone type yellow colorant was changed to Bayplast Yellow E2G (produced by Bayer) and, following otherwise the same procedure as in Example 20, a color filter of the present invention was formed.

Also in this case, similarly as in the case of Example 20, a patterned green color layer improved in spectral characteristics was obtained.

EXAMPLE 22

On the glass substrate of Example 20 having the green stripe filter formed thereon, a blue stripe pattern, a red stripe pattern and a protective film were formed to complete a tricolor stripe color filter of the present invention.

Figure 15:
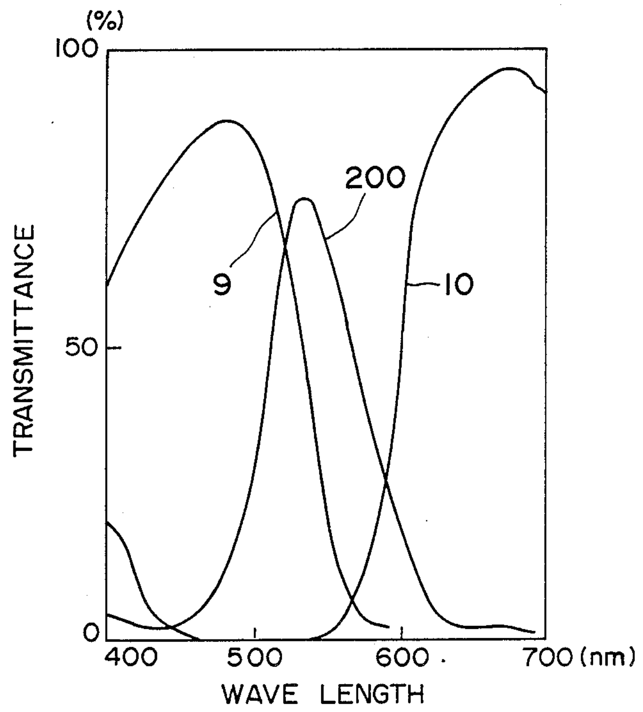
FIG. 15 is a graph showing the spectral transmittance of a colorant layer of a color filter of the present invention obtained in Example 19.

The spectral characteristics of the tricolor color filter thus formed are shown in FIG. 15.

EXAMPLE 23

With the use of a thin film transistor as the substrate, a color liquid crystal display device comprising the color filter of Example 22 formed on said substrate was prepared in the same manner as in Example 3.

The liquid crystal display device for color thus formed showed good operation characteristics and, as to the spectral characteristic of the color filter, the same effects as in Example 20 and 22 were obtained.

EXAMPLE 24

In place of providing a tricolor color filter on the picture element electrode, it was provided on the counter-electrode, and, following otherwise the same procedure as in Example 23, a liquid crystal display device for color having a color filter of the present invention was obtained.

The color liquid crystal display device thus formed showed good operation characteristics, and the same effects as in Example 19 and Example 21 could be obtained with respect to spectral characteristics of the color filter.

EXAMPLE 25

Except for using a wafer having a CCD (charge coupled device) thereon as the substrate and forming a tricolor stripe color filter so that the respective colored patterns of the color filter may be arranged corresponding to the respective light-receiving cells of the CCD, in the same manner as in Example 22, a color solid image pick-up device having a color filter of the present invention was formed.

The color solid image pick-up device thus formed showed good operation characteristics, and the same effects as in Example 20 and Example 22 could be obtained with respect to spectral characteristics of the color filter.

EXAMPLE 26

On a wafer having a CCD formed thereon, tho color filter formed in Example 22 was plastered with registration so that the respective colored patterns of the color filter were arranged corresponding to the respective light-receiving cells of the CCD to form a color solid image pick-up device.

The color solid image pick-up device thus formed showed good operation characteristics, and the same effects as in Example 19 an Example 21 could be obtained with respect to spectral characteristics of the color filter.

EXAMPLE 27

Except for using the color filter of Example 22, a color photosensor array was prepared in the same manner as in Example 7.

Also in the color photosensor array formed in this Example, the same effects as obtained in Examples 20 and 22 could be obtained during formation of the color filter, and the color photosensor obtained was found to show good operation characteristics.

EXAMPLE 28

A color photosensor array was formed by plastering 'the color filter formed in Example 22 on the photosensor array formed in Example 27 with an adhesive.

The color photosensor formed in this Example was also found to show good operation characteristics similarly as that formed in Example 27.

What is claimed is:

1. A color filter comprising a vapor deposited green colorant layer, said green colorant layer comprising 1 part by volume of an octa-4,5-phenylphthalocyanine colorant and from 1–5 parts by weight of a yellow colorant selected from the group consisting of isoindolinone and antraquinone colorants.

2. The color filter according to claim 1, wherein said ccta-4,5-phenylphthalocyanine colorant is octa-4,5-phenylphthalocyanine or a metal complex represented by the following structure formula:

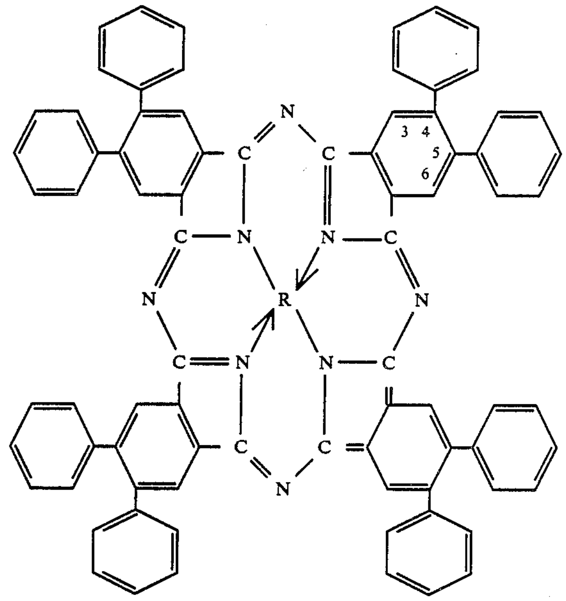

wherein R is Cu, GaOH, VO, Ni, Pd, Pb, Mg, Ca or Co.

3. The color filter according to claim 1, which comprises a substrate, and said green colorant layer is a patterned colorant layer formed on the substrate.

4. The color filter according to claim 3, wherein said substrate is a picture element electrode of a liquid crystal display device.

5. The color filter according to claim 3, wherein said substrate is a counter electrode of a liquid crystal device.

6. The color filter according to claim 3, wherein said substrate is a solid image pick-up device 7. The color filter according to claim 3, wherein said substrate is a photosensor array.

8. The color filter according to claim 3, wherein said substrate is a glass plate.

9. A solid image pick-up device, comprising: a wafer having a charge coupled device formed thereon, and the color filter according to claim 8 applied onto the wafer.

10. A color photosensor array, comprising: a photosensor array, and the color filter according to claim 8 applied onto the photosensor array.

11. The color filter according to claim 3, wherein said green colorant layer is a patterned colorant layer which has been obtained by providing a substrate having a resist pattern thereon, vapor-depositing said octa-4,5-phenylphthalocyanine colorant onto the substrate to form a vapor-deposited layer of the colorant, and removing a portion of the vapor-deposited colorant layer along with the resist pattern to leave the patterned green colorant layer.

12. The color filter according to claim 1, wherein said yellow colorant is said isoindolinone colorant.

13. The color filter according to claim 12, wherein said isoindolinone colorant is a compound represented by the formula:

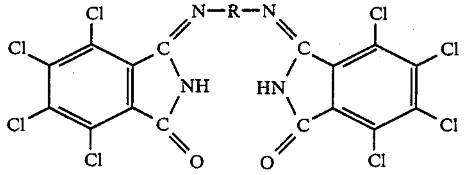

wherein R is a group selected from the group consisting of:

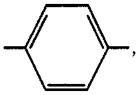 , 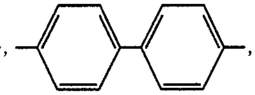 , 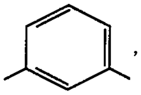 ,

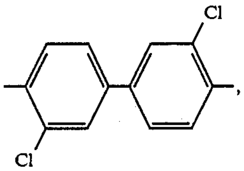 , 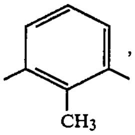 ,

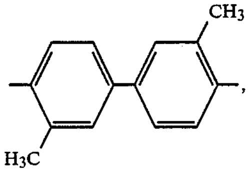 ,

 ,

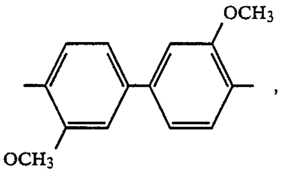 ,

-continued

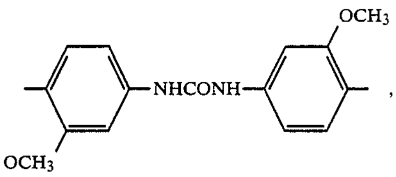 ,

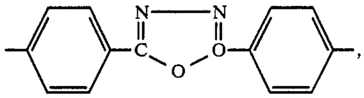 ,

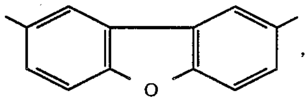 , and

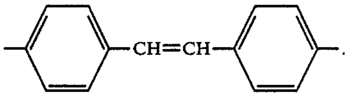 .

14. The color filter according to claim 12, which comprises a substrate, and said green colorant layer is a patterned colorant layer formed on the substrate.

15. The color filter according to claim 14, wherein said substrate is a picture element electrode of a liquid crystal display device.

16. The color filter according to claim 14, wherein said substrate is a counter electrode of a liquid crystal device.

17. The color filter according to claim 14, wherein said substrate is a solid image pick-up device.

18. The color filter according to claim 14, wherein said substrate is a photosensor array.

19. The color filter according to claim 1, wherein said yellow colorant is said anthraquinone colorant.

20. The color filter according to claim 19, wherein said anthraquinone colorant is a compound selected from the group consisting of those compounds represented by the following structural formulas:

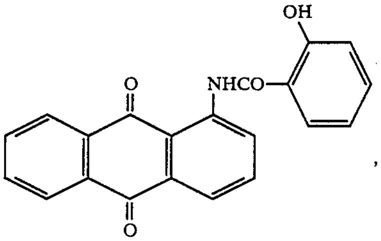 ,

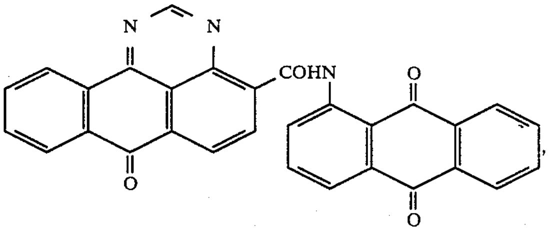 ,

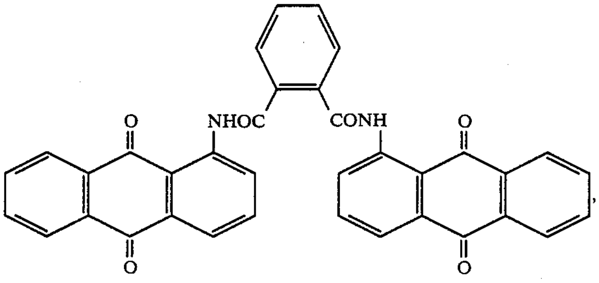 ,

-continued
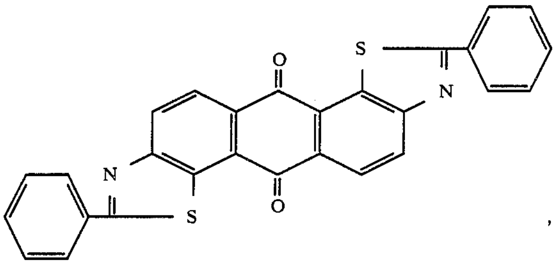
,
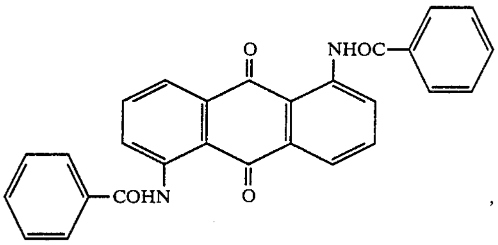
,
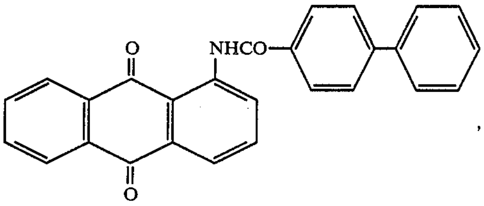
,
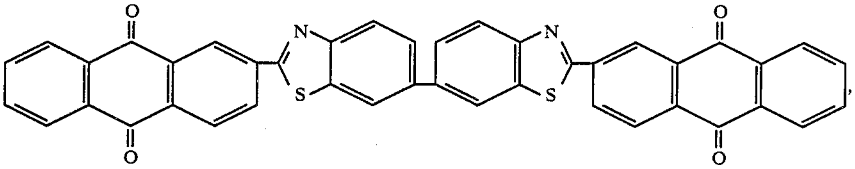
,
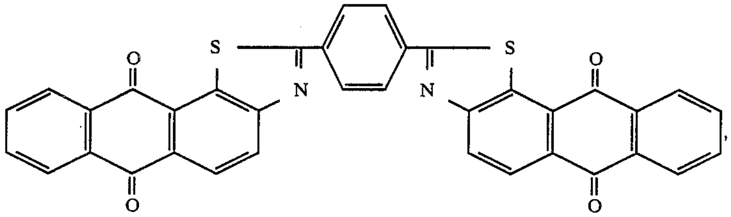
,
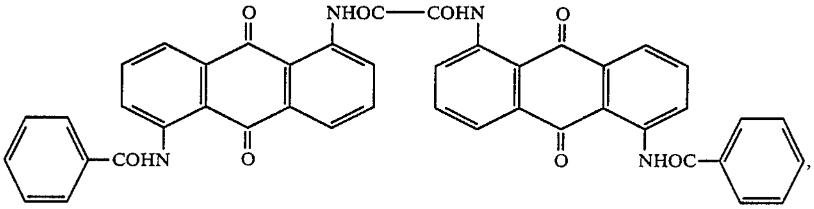
,
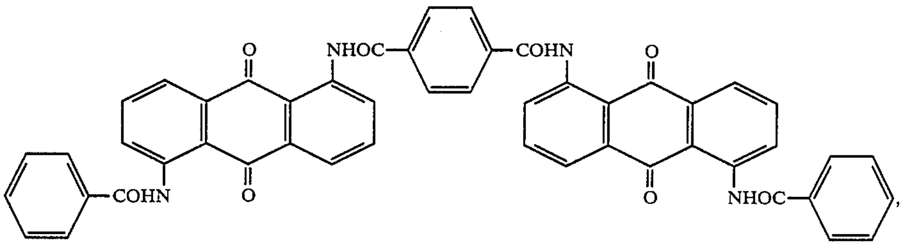
,
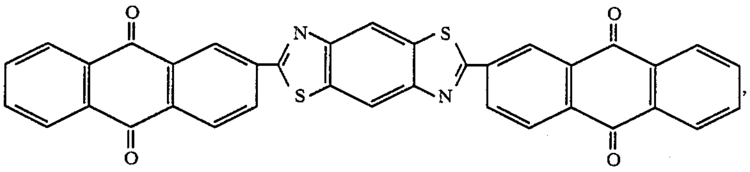
, -continued

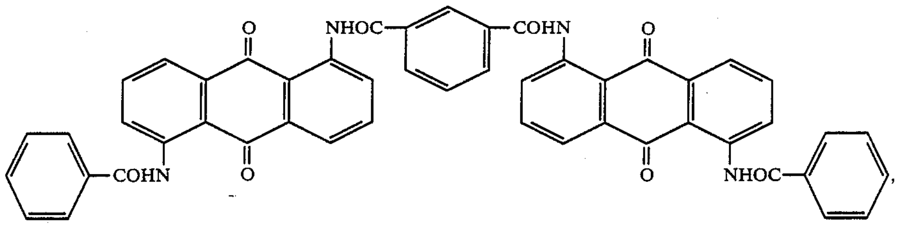,

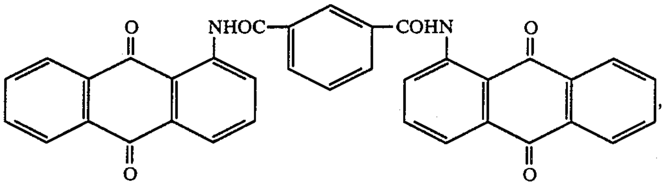,

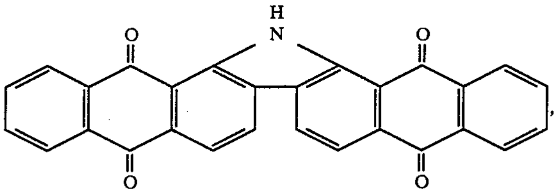,

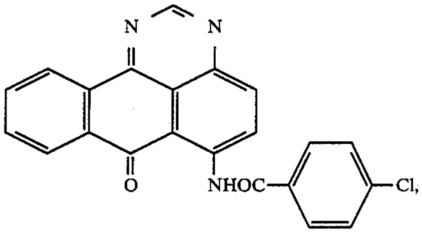,

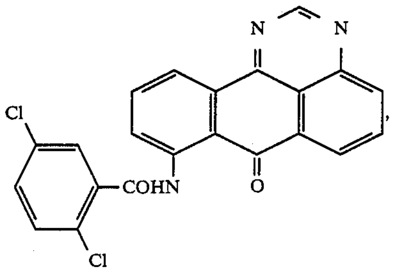,

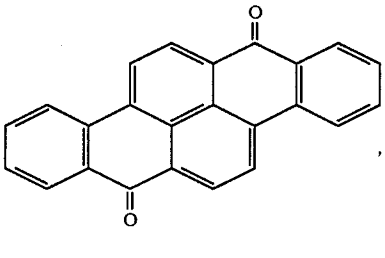, and

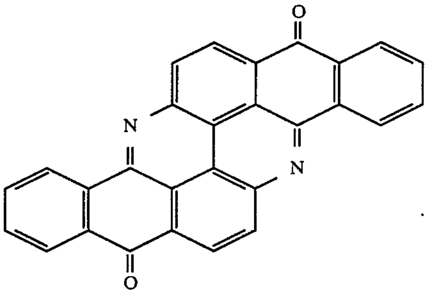

21. The color filter according to claim 19, which comprises a substrate, and said green colorant layer is a patterned colorant layer formed on the substrate.

22. The color filter according to claim 19, wherein said substrate is a picture element electrode of a liquid crystal display device.

23. The color filter according to claim 19, wherein said substrate is a counter electrode of a liquid crystal device.

24. The color filter according to claim 19, wherein said substrate is a solid image pick-up device.

25. The color filter according to claim 19, wherein said substrate is a photosensor array.

* * * * *

UNITED STATES PATENT AND TRADEMARK OFFICE

CERTIFICATE OF CORRECTION

PATENT NO. : 4,793,692

DATED : December 27, 1988

INVENTOR(S) : MASARU KAMIO, ET AL.

It is certified that error appears in the above-identified patent and that said Letters Patent is hereby corrected as shown below: Title page:

AT [56] REFERENCES CITED

Other Publications, "Derkachev," should read --Derkacheva,--.

COLUMN 3

Line 14, "Example 19." should read --Example 22.--.

COLUMN 9

Line 64, "C.I. No. 65005," should read --C.I. No. 65405,--.

COLUMN 23

Line 62, "antraquinone" should read --anthraquinone--.
Line 65, "ccta-4,5-phenylphthalocyanine" should read --octa-4,5-phenylphthalocyanine--.
Line 68, "structure" should read --structural--.

UNITED STATES PATENT AND TRADEMARK OFFICE

CERTIFICATE OF CORRECTION

PATENT NO. : 4,793,692

DATED : December 27, 1988

INVENTOR(S) : MASARU KAMIO, ET AL.

It is certified that error appears in the above-identified patent and that said Letters Patent is hereby corrected as shown below:

COLUMN 24

Line 39, "device" should read --device.--
Line 46, "charge coupled" should read --charge-coupled--.

Signed and Sealed this

Twenty-second Day of August, 1989

*Attest:*

DONALD J. QUIGG

*Attesting Officer*

*Commissioner of Patents and Trademarks*